(12) United States Patent
Chen et al.

(10) Patent No.: US 10,606,394 B2
(45) Date of Patent: Mar. 31, 2020

(54) TOUCH STRUCTURE, TOUCH PANEL AND TOUCH DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Weixiong Chen, Beijing (CN); Bin Li, Beijing (CN); Xin Li, Beijing (CN); Hanqing Liu, Beijing (CN); Pengju Zhang, Beijing (CN); Le Zhang, Beijing (CN); Xuchen Yuan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/019,440

(22) Filed: Jun. 26, 2018

(65) Prior Publication Data

US 2019/0204965 A1 Jul. 4, 2019

(30) Foreign Application Priority Data

Jan. 2, 2018 (CN) .......................... 2018 1 0003015

(51) Int. Cl.
*G06F 3/041* (2006.01)
*G02F 1/1335* (2006.01)
*G02F 1/1333* (2006.01)
*H01L 27/12* (2006.01)
*G06F 3/01* (2006.01)

(52) U.S. Cl.
CPC ........ *G06F 3/0412* (2013.01); *G02F 1/13338* (2013.01); *G02F 1/133345* (2013.01);
(Continued)

(58) Field of Classification Search
CPC ................. G06F 3/0412; G06F 3/0414; G06F 2203/04103; G02F 1/133345;
(Continued)

(56) References Cited

U.S. PATENT DOCUMENTS 9,495,035 B2 * 11/2016 Lee .......................... G06F 3/041
2015/0042573 A1 * 2/2015 Grant ..................... G06F 3/016
345/173

(Continued)

FOREIGN PATENT DOCUMENTS

CN 202995672 U 6/2013
CN 105892757 A 8/2016
(Continued)

OTHER PUBLICATIONS

Chinese First Office Action dated Dec. 26, 2019, received for Chinese Application No. 201810003015.1, 14 pages.

*Primary Examiner* — Peter D McLoone
(74) *Attorney, Agent, or Firm* — Kinney & Lange, P.A.

(57) ABSTRACT

A touch structure, a touch panel and a touch display device are disclosed. The touch structure includes: a sensing film configured to sense a pressure applied on the sensing film to generate an electrical signal; and a heating film disposed on a side of the sensing film and configured to generate heat in response to a determination, based on the electrical signal, that the value of the pressure applied on the sensing film is greater than a preset pressure value.

15 Claims, 3 Drawing Sheets

(52) U.S. Cl.
CPC .. *G02F 1/133512* (2013.01); *G02F 1/133514* (2013.01); *G06F 3/016* (2013.01); *G06F 3/0414* (2013.01); *G06F 3/04144* (2019.05); *H01L 27/1214* (2013.01); *G06F 2203/04103* (2013.01)

(58) Field of Classification Search
CPC .......... G02F 1/13338; G02F 1/133512; G02F 1/133514; H01L 27/1214
See application file for complete search history.

(56) References Cited

U.S. PATENT DOCUMENTS

| | | | | |
|---|---|---|---|---|
| 2015/0324049 | A1* | 11/2015 | Kies | G06F 3/0414 345/156 |
| 2016/0139718 | A1* | 5/2016 | Lee | G06F 3/041 345/173 |
| 2016/0378190 | A1* | 12/2016 | Park | G06F 3/0346 345/173 |
| 2017/0075448 | A1* | 3/2017 | Kang | G06F 3/044 |
| 2017/0178470 | A1* | 6/2017 | Khoshkava | G06F 3/016 |
| 2018/0224968 | A1* | 8/2018 | Church | G06F 3/0412 |
| 2018/0275757 | A1* | 9/2018 | Cruz-Hernandez | G06F 3/016 |
| 2018/0365466 | A1* | 12/2018 | Shim | G06F 3/0421 |
| 2019/0064927 | A1* | 2/2019 | Tachi | G06F 3/01 |
| 2019/0201785 | A1* | 7/2019 | Heubel | A63F 13/212 |

FOREIGN PATENT DOCUMENTS

| | | |
|---|---|---|
| CN | 106066741 A | 11/2016 |
| JP | 05196951 A | 8/1993 |
| JP | 2006201575 A | 8/2006 |

* cited by examiner

TOUCH STRUCTURE, TOUCH PANEL AND TOUCH DISPLAY DEVICE

CROSS-REFERENCE TO RELATED APPLICATIONS

This application claims the benefit of Chinese Patent Application No. 201810003015.1 filed on Jan. 2, 2018 in the State Intellectual Property Office of China, the whole disclosure of which is incorporated herein by reference.

TECHNICAL FIELD

At least one embodiment of the present disclosure relates to display technology, and more specifically, to a touch structure, a touch panel and a manufacturing method thereof, and a touch display device.

BACKGROUND

With the touch display device getting thinner, the glass substrate in the touch display device becomes thinner and thinner. The various functions of the touch display device are realized by touching and pressing the glass substrate. However, frequent touch and press operation may lead to deformation of the glass substrate due to its relatively small thickness, resulting in undesirable display defects in the touch and press areas.

SUMMARY

At least one embodiment of the present disclosure provides a touch structure, a touch panel and a touch display device.

According to the embodiments of one aspect of the present disclosure, there is provided a touch structure comprising: a sensing film configured to a sense pressure applied on the sensing film to generate an electrical signal; and a heating film disposed on a side of the sensing film and configured to generate heat in response to a determination, which is made based on the electrical signal, that a value of the pressure applied on the sensing film is greater than a preset pressure value.

According to at least one embodiment of the present disclosure, the touch structure further comprises a substrate, on which at least one of the sensing film and the heating film is disposed; the sensing film comprises at least one sensing unit; and the heating film comprises at least one heater. Projections of the at least one sensing unit and the at least one heater on the substrate are at least partially overlapped with each other.

According to at least one embodiment of the present disclosure, the sensing film comprises a polymer-encapsulated carbon nanotube piezoelectric material or a polymer-encapsulated graphene semiconductor piezoelectric material.

According to at least one embodiment of the present disclosure, the heater is made of a metal alloy material and includes a plurality of bending segments connected with one another.

According to at least one embodiment of the present disclosure, the sensing film and the heating film each are made of a transparent material.

According to an embodiments of another aspect of the present disclosure, there is provided a touch panel, comprising: the touch structure according to any one of the above embodiments; an array substrate; a color filter substrate; a liquid crystal layer disposed between the array substrate and the color filter substrate; and a touch element configured to sense a touch action applied to the touch panel. The touch structure is disposed in at least one of the array substrate and the color filter substrate.

According to at least one embodiment of the present disclosure, the heating film is disposed on a side of the array substrate that is close to the liquid crystal layer, and the sensing film is disposed on the color filter substrate.

According to at least one embodiment of the present disclosure, an insulating layer is provided between the heating film and the liquid crystal layer.

According to at least one embodiment of the present disclosure, the heating film and the sensing film are provided at positions corresponding to a black matrix of the color filter substrate.

According to at least one embodiment of the present disclosure, the sensing film includes at least one sensing unit; the heating film includes at least one heater; and projections of the at least one sensing film and the at least one heater on the array substrate are at least partially overlapped with each other.

According to at least one embodiment of the present disclosure, the sensing film comprises a polymer-encapsulated carbon nanotube piezoelectric material or a polymer-encapsulated graphene semiconductor piezoelectric material.

According to at least one embodiment of the present disclosure, the heater is made of a metal alloy material and includes a plurality of bending segments connected with one another.

According to at least one embodiment of the present disclosure, the heating film and the sensing film each are made of a transparent material and disposed at positions corresponding to pixel areas of the color filter substrate.

According to embodiments of yet another aspect of the present disclosure, there is provided a touch display device comprising: the touch panel according to any one of the above embodiments; a driving chip configured to control the heating film to generate heat in response to a determination, which is made based on the electrical signal generated from the sensing film, that a value of the pressure applied on the sensing film is greater than a preset pressure value, so as to heat a portion of the liquid crystal layer that is aligned with the heating film in a thickness direction of the touch panel.

According to an embodiments of still another aspect of the present disclosure, there is provided a touch panel, comprising: an array substrate; a color filter substrate; a liquid crystal layer disposed between the array substrate and the color filter substrate; at least one touch element configured to sense a touch action applied on the touch panel and generate an electrical signal indicating a value of a pressure applied on the touch element; a heating film disposed on a side of the touch element and configured to generate heat in response to a determination, which is made based on the electrical signal, that the value of the pressure applied on the touch element is greater than a preset pressure value, so as to heat a portion of the liquid crystal layer that is aligned with the heating film in a thickness direction of the touch panel.

According to at least one embodiment of the present disclosure, the heating film is disposed on a side of the array substrate that is close to the liquid crystal layer, and an insulating layer is disposed between the heating film and the liquid crystal layer.

According to at least one embodiment of the present disclosure, the heating film is disposed at a position corresponding to a black matrix of the color filter substrate.

According to at least one embodiment of the present disclosure, the heating film includes at least one heater, and projections of the at least one touch element and the corresponding at least one heater on the array substrate are at least partially overlapped with each other.

According to at least one embodiment of the present disclosure, the heater is made of metal alloy material and includes a plurality of bending segments connected with one another.

According to embodiments of yet another aspect of the present disclosure, there is provided a touch display device comprising: the touch panel according to any one of the above embodiments; and a driving chip configured to control the heating film to generate heat in response to the determination, which is made based on the electrical signal generated from the touch element, that the value of the pressure applied on the touch panel is greater than the preset pressure value.

It is to be understood that both the foregoing general description and the following detailed description are exemplary and explanatory only and do not limit the disclosure.

BRIEF DESCRIPTION OF THE DRAWINGS

The drawings herein are incorporated into and constitute a part of this specification, showing embodiments consistent with the present disclosure and serving to explain the principles of the present disclosure together with the description.

DETAILED DESCRIPTION OF THE EMBODIMENTS

Figure 1:
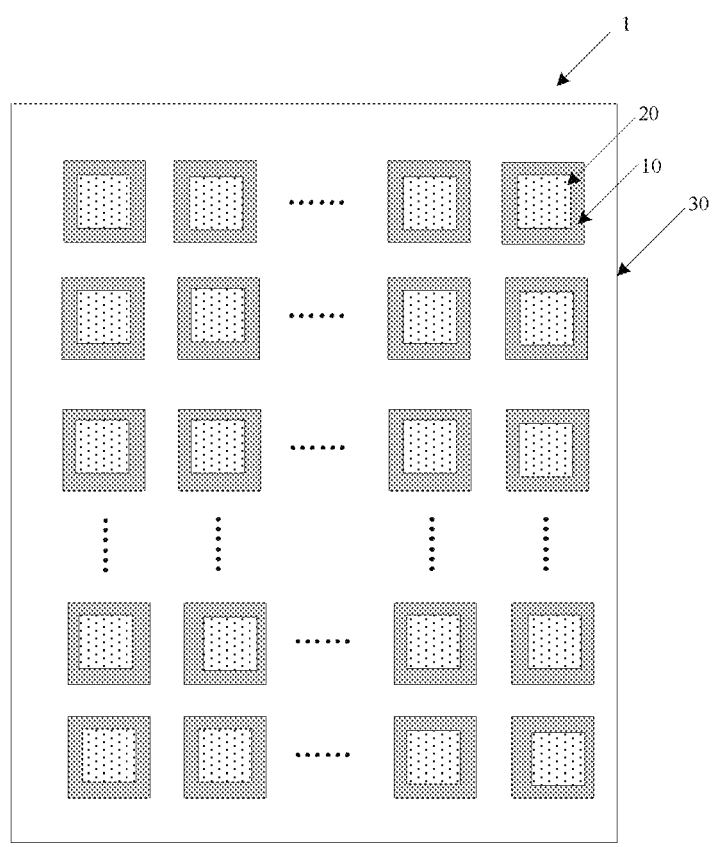
FIG. 1 is a schematic plan view of a touch structure according to an embodiment of the present disclosure.

Exemplary embodiments will be described in detail herein, examples of which are illustrated in the drawings. When the following description refers to the drawings, like numerals in different drawings indicate the same or similar elements, unless otherwise indicated. The embodiments described in the following exemplary embodiments do not represent all of the embodiments which are consistent with the present disclosure. Instead, they are merely examples of devices and methods consistent with some aspects of the disclosure as detailed in the appended claims.

Currently, touch display devices such as mobile phones and computers in daily use generally have a touch function. A touch display device using liquid crystal display includes liquid crystal packaged therein. Since the glass substrate of the touch display device is relatively thinner, frequent touch and press operation thereon may cause deformation of the glass substrate, and the deformation of the glass substrate in some touch and press areas may not be restored immediately due to the viscosity and elasticity of the liquid crystal, resulting in too much or too little liquid crystal existing in this area, which would lead to display defects such as yellow image and press Mura.

According to a general inventive concept of the embodiments of the present disclosure, there is provided a touch structure comprising:

a sensing film configured to sense pressure applied on the sensing film to generate an electrical signal; and a heating film disposed on one side of the sensing film and configured to generate heat in response to a determination, based on the electrical signal, that a value of the pressure applied on the sensing film is greater than a preset pressure value.

The touch structure of the embodiment of the present disclosure may be applied to a touch panel. The touch panel may further comprise touch elements for implementing touch function in addition to the above-mentioned sensing film and heating film. In an exemplary embodiment, the touch element may comprise a structure based on various touch principles, such as a resistance touch element, a capacitance touch element, or an infrared sensing touch element. For example, the capacitance touch element includes a touch sensing electrode and a touch driving electrode, and the capacitance between the touch sensing electrode and the touch driving electrode is detected so as to realize the touch function. The embodiments of the present disclosure do not limit the structure of other elements included in the touch structure.

The touch structure according to the embodiments of the present disclosure may be arranged in a touch display device. In a process for manufacturing the touch display device according to an embodiment, a touch panel and a display panel of the touch display device are separately prepared, and then attached and fixed to form a touch display device having a touch function. The touch panel includes a glass substrate and touch elements disposed on the glass substrate. The touch structure of the embodiments of the present disclosure may be disposed on the above touch panel. In a process for manufacturing the touch display device of another embodiment, the touch elements are directly integrated into the display panel. For example, the touch driving electrode and the touch sensing electrode of the touch element are respectively disposed on the array substrate and the color filter substrate of the display panel so as to prepare a touch display panel and thus form a touch display device having a touch function. The touch structure of the embodiment of the present disclosure may also be integrated into the array substrate and color filter substrate.

The touch display device generally has a display area and a frame area surrounding the display area. The liquid crystal is located in the display area, and the touch area is usually located in the display area to realize various functions by touch and press operation.

In an exemplary embodiment, the sensing film is made of a piezoelectric material based on a piezoelectric effect. Specifically, in the case where a certain pressure is applied to the sensing film, its resistance would change. In the case where a constant current or constant voltage is applied to the sensing film, an output voltage or output current therefrom would change due to change of a resistance of the sensing film. That is, a magnitude of the pressure is converted into a magnitude of the output voltage or output current, i.e., generating a sensing electrical signal.

In an exemplary embodiment, the sensing film is made of a piezoelectric material having piezoelectric effect, for example, piezoelectric crystal, piezoelectric ceramic, piezoelectric polymer (such as polyvinylidene fluoride (PVDF) film) or other piezoelectric materials.

In the embodiments of the present disclosure, the preset pressure value is a pressure value set as required. For example, the preset pressure value is equal to a touch pressure threshold that may cause display defects in the touch area. When a pressure having the touch pressure threshold is frequently applied to the touch area, the display defects may be caused. In addition, the preset pressure value may also be set slightly less than the above touch pressure threshold. It is appreciated for those skilled in the art that the specific value of the preset pressure value is associated with a thickness of the glass substrate in the touch panel. The thicker the glass substrate is, the greater the preset pressure value may be.

In the embodiments of the present disclosure, the heating film is disposed on one side of the sensing film. That is, the heating film may be disposed on any side of the sensing film. For example, the heating film is disposed above or below the sensing film, which is not limited in the embodiments of the present disclosure.

The sensing film may sense the pressure applied thereon. That is, in the case where a touch operation is performed on the touch area, the valve of the pressure applied on the touch display device may be sensed by the sensing film. When the valve of the pressure is greater than the preset pressure value, a heater is activated to generate heat. The heat generated by the heater may be transferred to the liquid crystal to reduce its viscosity and promote its flow, thereby avoiding too much or too little liquid crystal existing in some portions of the touch area, so as to improve the uniformity of the liquid crystal in the touch area. In this way, the touch display device including the touch structure may be prevented from having yellow image and the display defects due to the press Mura, thereby improving the display effect of the displayed image.

In an exemplary embodiment of the present disclosure, referring to FIG. 1, in the touch structure 1, the sensing film includes at least one sensing unit 10, and the heating film includes at least one heater 20. The projections of the at least one sensing unit 10 and the at least one heater 20 on a substrate on which the sensing unit 10 and the heater 20 are provided are at least partially overlapped with each other.

In this embodiment, the touch structure 1 includes the at least one sensing unit 10 and the at least one heater 20. The sensing unit 10 and the heater 20 are generally provided on a substrate 30. When the heater generates heat, the heat generated from the heater may be transferred to the liquid crystal at the position corresponding to this heater. Since the projections of the at least one sensing unit 10 and the at least one heater 20 on the substrate 30 are at least partially overlapped with each other, the liquid crystal in the position corresponding to this heater 20 is heated. In this way, the heating area for heating the liquid crystal may be more precisely controlled by the heaters, so that viscosity of the liquid crystal in the area, which corresponds to the portion of the touch area that is undergone the pressure greater than the preset pressure value, is reduced, and flow of the liquid crystal may be promoted, further increasing uniformity of the liquid crystal in the touch area and improving display effect of the displayed image.

In one embodiment, as shown in FIG. 1, the sensing unit 10 and the heater 20 are both arranged in an array. That is, a plurality of sensing units 10 and a plurality of heaters 20 are arranged in both the directions of rows and columns in the touch structure. The projections of each sensing unit 10 and each heater 20 on the substrate 30 are at least partially overlapped with each other. That is, the area of each sensing unit 10 and the area of each heater 20 are at least partially overlapped with each other in the projection direction.

Each sensing unit may respectively sense the value of the pressure applied thereto and then generate an electrical signal. By controlling the heater corresponding to the sensing unit to heat the liquid crystal at a corresponding position to the heater, heat operation to the liquid crystal at the corresponding position in the touch area may be more accurately controlled. Therefore, the liquid crystal at the corresponding position in the touch area has a reduced viscosity, and the uniformity of the liquid crystal in the touch area of the touch panel is improved, thereby avoiding the display defects and improving the display effect of the display image.

In one embodiment, the sensing film and the heating film may be configured to cover the entire touch area. In this case, the sensing film and the heating film may be made of a transparent material. Alternatively, the sensing units and the heaters may be arranged at only certain positions of the touch area, which may also achieve the objective of avoiding display defects of the present disclosure. That is not limited in the present disclosure.

It is noted that the touch area of the touch display device is usually arranged in the display area. However, when a plurality of sensing units and heaters are provided on the touch display device, the overall effect of the displayed image in the display area would not be affected, since the sensing unit and the heater are generally sized invisible to the naked eye.

The display area typically includes a plurality of pixel areas, as well as data lines that are arranged to separate the pixel areas or non-pixel areas where other opaque layers are located. The pixel area is transparent to light, and the non-pixel area is not transparent to light. However, the non-pixel area does not affect the display of the image, since it is tiny enough to be invisible to the naked eye. In order to minimize negative impact on the displayed image, the sensing unit and the heater described above may be made of a transparent material, or the sensing unit and the heater may be arranged in the non-pixel area.

The area of the heater shown in FIG. 1 is less than the area of the sensing unit, and the sensing unit may be provided to completely cover the heater in the thickness direction of the substrate. It is noted that, in FIG. 1, an exemplary positional relationship between the heater and the sensing unit is schematically shown. However, in practical applications, the area of the heater may also be equal to or greater than that of the sensing unit. The projections of each heater and each corresponding sensing unit in the thickness direction of the substrate are not necessarily overlapped completely with each other. The heater may heat the liquid crystals at the corresponding positions respectively as long as the projections of this heater and the corresponding sensing unit are partially overlapped, so that the viscosity of the liquid crystal in the portion of the touch area that corresponds to this sensing unit may be reduced, thereby avoiding display defects.

In some embodiments, the sensing film described above comprises polymer-encapsulated carbon nanotube piezoelectric material or polymer-encapsulated graphene semiconductor piezoelectric material.

In this embodiment, since polymer-encapsulated carbon nanotube or polymer-encapsulated graphene semiconductor material (in which the polymer may comprises a polyurethane or other polyester polymer) have high electrical conductivity and high light transmittance. Therefore, incorporating the materials described above into the piezoelectric material may increase the sensitivity of the sensing film, and enable the touch structure to have high transmittance, thereby improving brightness of the touch display device employing the touch structure.

Figure 2:
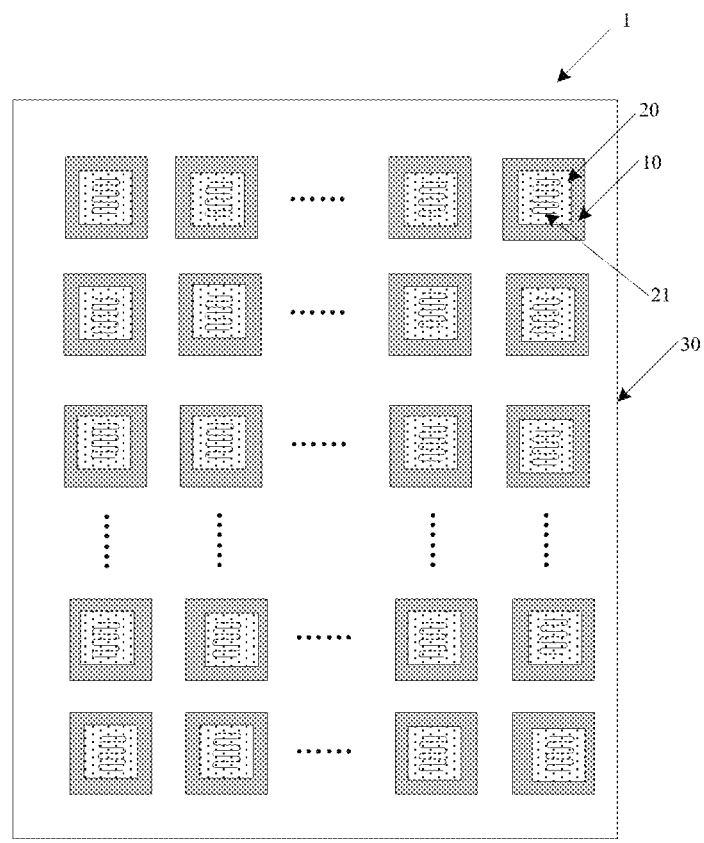
FIG. 2 is a schematic plan view of a touch structure according to another embodiment of the present disclosure.

In an exemplary embodiment, as shown in FIG. 2, in the touch structure 1, each heater 20 is made of metal alloy material and includes a plurality of bending segments 21 connected together.

In the present embodiment, the heater is made of the metal alloy material, which generally has high resistivity, to increase heating efficiency of the heater. The plurality of bending segments connected with one another are formed as a snake-like shape, which may further increase the heat efficiency generated in a limited area.

Figure 3:
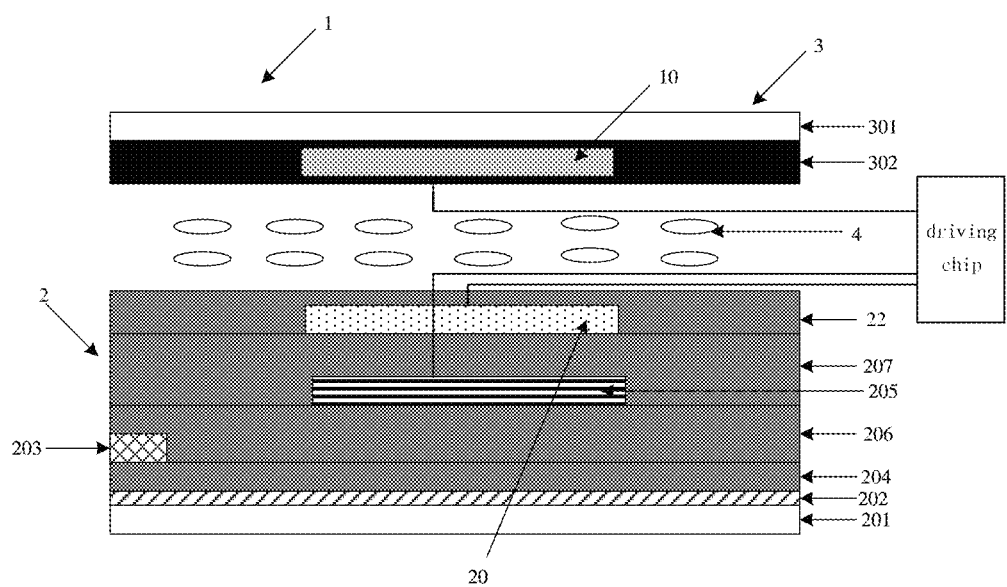
FIG. 3 is a schematic partial sectional view of a touch panel according to an embodiment of the present disclosure.

According to embodiments of another aspect of the present disclosure, there is provided a touch panel. As shown in FIG. 3, the touch panel 1 includes the touch structure of any one of the above embodiments, an array substrate 2, a color filter substrate 3, a liquid crystal layer 4 disposed between the array substrate 2 and the color filter substrate 3, and a touch element 205 configured to sense a touch action applied to the touch panel. The touch structure is disposed on at least one of the array substrate and the color filter substrate.

In an exemplary embodiment, the heating film 20 is provided on a side of the array substrate that is close to the liquid crystal layer, and the sensing film 10 is provided on the color filter substrate 3. The color filter substrate is such a substrate that is usually located on the array substrate and close to the touch and press position, or such a substrate that is directly subjected to a touch pressure. Through providing the sensing film on the color filter substrate, the value of the touch and press pressure applied to the touch panel may be detected more accurately, so that the heating film may heat the liquid crystal in the liquid crystal layer that is in the corresponding area to the heating film. In an alternative embodiment, the sensing film 10 is made of a piezoelectric material and provided in the array substrate.

Disposing the heating film on the side of the array substrate that is close to the liquid crystal layer may facilitate transferring the heat from the sensing film to the liquid crystal at the corresponding position, so that heat is distributed more uniformly, thereby further improving the uniformity of the liquid crystal in the touch area and the display effect of the displayed image.

In a further embodiment, the heating film 20 and the sensing film 10 are disposed at positions corresponding to a black matrix 302 of the color filter substrate 3. The color filter substrate is usually provided with the black matrix and color filter units. The black matrix is generally arranged in a grid-like form in the display area. Each black matrix is disposed between two adjacent color filter units. The black matrix is located in the non-pixel area. Therefore, the heating film and the sensing film are disposed at positions corresponding to the black matrix of the color filter substrate, which may minimize negative impact on the displayed image and improve the display effect of the displayed image and light transmittance.

Referring to FIG. 3, the array substrate 2 generally includes a first substrate 201. The first substrate 201 may further include other layers thereon, such as a gate electrode 202, a source/drain electrode 203, a first insulating layer 204 between the gate electrode 202 and the source/drain 203, a touch element 205, a second insulating layer 206 between the source/drain electrode 203 and the touch element 205, a third insulating layer 207 between the touch element 205 and the heating film 20, and the like. The color filter substrate 3 generally includes a second substrate 301. The second substrate 301 may further include thereon a color filter layer and the like. In an exemplary embodiment, the touch element is a capacitance touch element and includes a touch driving electrode disposed in the array substrate and a touch sensing electrode disposed in the color filter substrate. The touch panel of the embodiment of the present disclosure may be based on various types of touch panels, for example, a resistance touch panel, a capacitance touch panel, or an infrared sensing touch type touch panel. In some embodiments, as shown in FIG. 3, the surface of the heating film 20 of the touch structure of the embodiment of the present disclosure is covered with an insulating layer 22. In this way, the insulating layer 22 is disposed between the heating film and the liquid crystal layer. The insulating layer is provided to prevent the heating film from directly being in contact with the liquid crystal, so that when the heating film heats the liquid crystal, damage to the liquid crystal attached thereto may be avoided, thereby improving the yield of the touch panel.

In one embodiment, the sensing film and the heating film may be configured to cover the entire touch area. In this case, the sensing film and the heating film may be made of a transparent material and disposed at the position corresponding to the pixel areas of the color filter substrate. Alternatively, the sensing units and the heaters may be arranged at only certain positions of the touch area. Both technical solutions may achieve effect of avoiding display defects of the present disclosure of the present disclosure. That is not limited in the present disclosure.

According to embodiments of another aspect of the present disclosure, there is provided a touch display device comprising the touch panel according to any one of the above embodiments and a driving chip. The driving chip is connected to the sensing film and the heating film respectively and configured to control the heating film to generate heat in response to a determination, which is made based on the electrical signal generated from the sensing film, that the value of the pressure applied on the sensing film is greater than a preset pressure value, so as to heat a portion of the liquid crystal layer that is aligned with the heating film in a thickness direction of the touch panel.

In an exemplary embodiment, the driving chip includes an integrated circuit chip. A constant current or voltage may be applied to the sensing film by means of an integrated circuit chip or a power chip in the touch display device. The electrical signal generated from the sensing film is transmitted to the driving chip. The driving chip may determine whether the value of the pressure applied on the sensing film is greater than a preset pressure value based on the value of the electrical signal. In the case where the pressure is greater than the preset pressure value, an electrical signal may be output to the heating film to control the heating film to generate heat. The electrical signal may be current or voltage having a certain level. The heating film is made of a material having a certain resistivity. Therefore, the heating film may generate heat while current flows therethrough. The heat generated therein may heat the liquid crystal at the position corresponding to the heating film, so that the viscosity of the liquid crystal in the portion of the touch area that corresponds to the pressure sensing film is reduced. In this way, the flow of the liquid crystal in this portion of the touch area may be promoted, avoiding too much or too little liquid crystal existing in this portion of the touch area and improving the uniformity of the liquid crystal in the touch area of the entire touch display device. In this way, the touch display device including the touch panel may be prevented from having yellow image and display defects due to the press Mura, thereby improving the display effect of the displayed image.

The driving chip may also output electrical signals with different current or voltage levels as required. The heating film may generate heat with different level under control of electrical signals with different current or voltage levels, so as to control the temperature of the liquid crystal effectively and thus control the viscosity of the liquid crystal more accurately.

In an exemplary embodiment, as shown in FIG. 3, a conductive line may be disposed on the touch panel to connect the driving chip with the sensing film and the heating film. In the case where a plurality of sensing units and a plurality of heaters are provided in the touch panel, the sensing units in each row or each column may be connected to a conductive line arranged in a corresponding row or a corresponding column. Each conductive line extends to the frame area and is connected to the driving chip in the frame area. Similarly, the heaters located in each row or each column are connected with a conductive line arranged in a corresponding row or a corresponding column, each conductive line extends to the frame area and is connected to the driving chip in the frame area.

Figure 4:
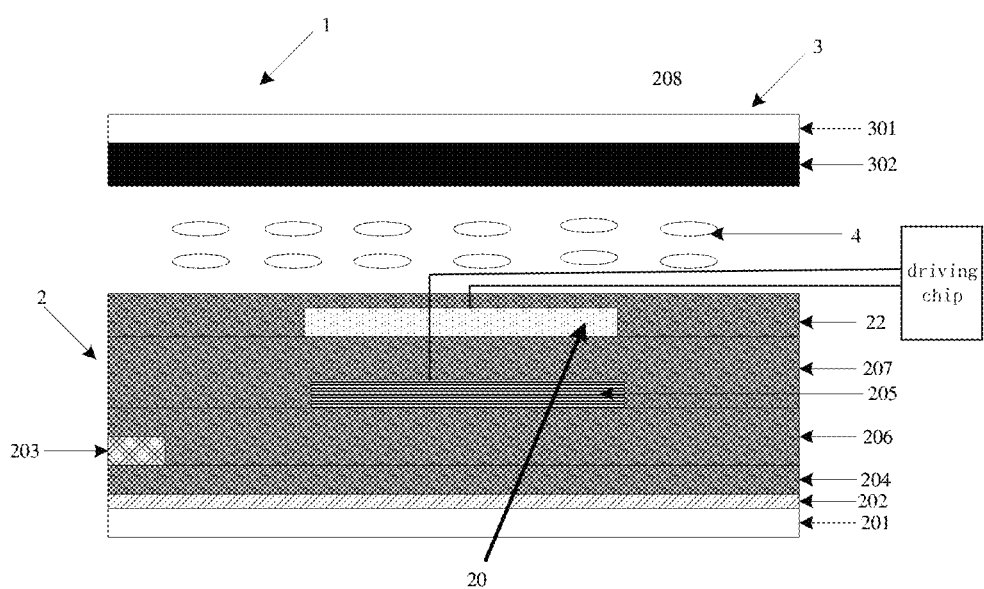
FIG. 4 is a schematic partial sectional view of a touch panel according to another embodiment of the present disclosure.

Referring to FIG. 4, according to embodiments of still another aspect of the present disclosure, there is provided a touch panel comprising: an array substrate 2; a color filter substrate 3; a liquid crystal layer 4 disposed between the array substrate 2 and the color filter substrate 3; at least one touch element 205 configured to sense a touch action applied on the touch panel and generate an electrical signal indicating a value of a pressure applied on the touch element 205; and a heating film 20 disposed on a side of the touch element 205 and configured to generate heat in response to a determination, which is made based on the electrical signal generated from the touch element, that the value of the pressure applied on the touch element is greater than a preset pressure value, so as to heat a portion of the liquid crystal layer 4 that is aligned with the heating film in a thickness direction of the touch panel.

According to the touch panel of the embodiment of the present disclosure, the touch action applied on the touch panel is sensed by the touch element 205 so that the touch position may be determined and an electrical signal indicating the value of the pressure applied on the touch element 205 may be generated. The heating film 20 generate heat in response to a determination, which is made based on the electrical signal generated from the touch element, that the value of the pressure applied on the touch element is greater than the preset pressure value, so as to heat the portion of the liquid crystal layer 4 that is aligned with the heating film 20 in the thickness direction of the touch panel, so that the liquid crystal in the portion of the touch area that corresponds to the sensing film may be heated. In this way, the liquid crystal in the touch area may be heated by the heating film, so that viscosity of the liquid crystal in a touch area may be reduced and flow of the liquid crystal may be promoted rapidly, further increasing uniformity of the liquid crystal in the touch area and improving display effect of a displayed image.

The touch panel of the embodiment of the present disclosure may be based on various types of touch panels, for example, a resistance touch panel, a capacitance touch panel, or an infrared sensing touch panel.

In an embodiment, the heating film 20 is disposed on a side of the array substrate 2 that is close to the liquid crystal layer 4, and an insulating layer 22 is disposed between the heating film 20 and the liquid crystal layer 4. Disposing the heating film on the side of the array substrate that is close to the liquid crystal layer may facilitate transferring the heat from the sensing film to the liquid crystal at the corresponding position to the heating film, so that heat is distributed more uniformly, thereby further improving the uniformity of the liquid crystal in the touch area and the display effect of the displayed image. The insulating layer 22 is provided between the heating film and the liquid crystal layer to prevent the heating film from directly being in contact with the liquid crystal, so that when the heating film heats the liquid crystal, damage to the liquid crystal attached thereto may be avoided, thereby improving the yield of the touch panel.

In a further embodiment, the heating film 20 is disposed at positions corresponding to a black matrix 302 of the color filter substrate 1. The color filter substrate 1 is usually provided with the black matrix 302 and color filter units. The black matrix 302 is generally arranged in a grid-like form in the display area. Each black matrix is disposed between two adjacent color filter units. The black matrix is located in the non-pixel area. Therefore, the heating film and the sensing film are disposed at positions corresponding to the black matrix of the color filter substrate, which may minimize negative impact on the displayed image and improve the display effect of the displayed image and light transmittance.

In one embodiment, the heating film includes at least one heater, and the projections of the at least one touch element and the at least one heater on the array substrate are at least partially overlapped respectively. Each touch element may sense the value of the pressure applied thereon, thereby generating the electrical signal. By controlling the heater corresponding to the touch element to heat the liquid crystal at a corresponding position to the heater, heat operation to the liquid crystal at the corresponding position in the touch area may be more accurately controlled. Therefore, the liquid crystal at the corresponding position in the touch area has a reduced viscosity, and the uniformity of the liquid crystal in the touch area of the touch panel is improved, thereby avoiding the display defects and improving the display effect of the display image.

In an embodiment, the heater is made of metal alloy material and includes a plurality of bending segments connected together. The heater is made of the metal alloy material, which generally has high resistivity, to increase heating efficiency of the heater. The plurality of bending segments connected together are formed as a snake-like shape, which may further increase the heat efficiency generated in a limited area.

Referring to FIG. 4, the array substrate 2 generally includes a first substrate 201. The first substrate 201 may further include other layers thereon, such as a gate electrode 202, a source/drain electrode 203, a first insulating layer 204 between the gate electrode 202 and the source/drain 203, a touch element 205, a second insulating layer 206 between the source/drain electrode 203 and the touch element 205, a third insulating layer 207 between the touch element 205 and the heating film 20, and the like. The color filter substrate 3 generally includes a second substrate 301. The second substrate 301 may further include thereon a color filter layer and the like. In an exemplary embodiment, the touch element is a capacitive touch element and includes a touch driving electrode disposed in the array substrate and a touch sensing electrode disposed in the color filter substrate.

According to embodiments of yet another aspect of the present disclosure, there is provided a touch display device comprising: the touch panel according to any one of the above embodiments; and a driving chip configured to control the heating film 20 to generate heat in response to a determination, which is made based on the electrical signal generated from the touch element 205, that the value of the pressure applied on the touch panel is greater than a preset pressure value, so as to heat a portion of the liquid crystal layer 4 that is aligned with the heating film 20 in a thickness direction of the touch panel.

In an exemplary embodiment, the driving chip includes an integrated circuit chip. A constant current or voltage may be applied to the touch element by means of an integrated circuit chip or a power chip in the touch display device. The electrical signal generated from the touch element is transmitted to the driving chip. The driving chip may detect the touch action based on the electrical signal and thus determine the position of the touch action, and may determine whether the value of the pressure applied on the touch element is greater than the preset pressure value based on the level of the electrical signal. In the case where the pressure is greater than the preset pressure value, an electrical signal may be output to the heating film to control the heating film to generate heat. The electrical signal may be current or voltage having a certain level. The heating film is made of a material having a certain resistivity. Therefore, the heating film may generate heat while current flows therethrough. The heat generated therein may heat the liquid crystal at the position corresponding to the heating film, so that the viscosity of the liquid crystal in the portion of the touch area that corresponds to the heating film is reduced. In this way, the flow of the liquid crystal in this portion of the touch area may be promoted, avoiding too much or too little liquid crystal existing in this portion of the touch area and improving the uniformity of the liquid crystal in the touch area of the entire touch display device. In this way, the touch display device including the touch panel may be prevented from having yellow image and display defects due to the press Mura, thereby improving the display effect of the displayed image.

The driving chip may also output electrical signals with different current or voltage levels as required. The heating film may generate heat with different level under control of electrical signals with different current or voltage levels, so as to control the temperature of the liquid crystal effectively and thus control the viscosity of the liquid crystal more accurately.

An embodiment of the present disclosure further provides a method of manufacturing a touch structure, comprising steps of:

forming a sensing film; and forming a heating film on a side of the sensing film.

In this embodiment, a method of manufacturing a touch structure is provided to manufacture the touch structure described above.

In an embodiment, the sensing film includes at least one sensing unit; the heating film includes at least one heater; the projections of the at least one sensing film and the at least one heater on a substrate on which the at least one sensing film and the at least one heater are located are at least partially overlapped with each other.

The process for manufacturing the sensing film and the heating film may adopt the process for preparing a film in the prior art. For example, a piezoelectric material layer and an electrically conductive material layer may be formed on a touch panel by a film manufacturing process, such as a vacuum sputtering method or a vacuum evaporation method. Then portions of the material layer that are at desired position may be left through a patterning process such as exposure, development, etching and the like, so as to form the pattern of the sensing film and heating film. The pattern of the sensing film may be a pattern including a plurality of sensing units arranged in a matrix, and the pattern of the heating film may be a pattern including a plurality of heaters arranged in a matrix.

An embodiment of the present disclosure further provides a method of manufacturing a touch panel, wherein the touch panel comprises an array substrate and a color filter substrate. A heating film is formed on the array substrate, and a sensing film is formed on the color filter substrate.

In the touch structure, the touch panel and the touch display device according to any one of the above embodiments of the present disclosure, the sensing film or the touch element may be configured to detect the value of the pressure applied thereto. In the case where a touch action is performed on the touch area, the valve of the pressure applied on the touch panel may be sensed. When the valve of the pressure is greater than the preset pressure value, the heaters is activated to generate heat. The heat generated by the heater may be transferred to the liquid crystal to reduce its viscosity and promote its flow, thereby avoiding too much or too little liquid crystal existing in some portions of the touch area, so as to improve the uniformity of the liquid crystal in the touch area. In this way, the touch display device including the touch structure may be prevented from having yellow image and display defects due to the press Mura, thereby improving the display effect of the displayed image.

It is noted that, in the drawings, the dimensions of layers and areas may be enlarged for clarity of the illustration, and the actual dimensions of layers and areas are not exactly equivalent to the illustrated scale or size. It is appreciated that when an element or layer is referred to as being "on" another element or layer, it may be directly on another element or layer, or an intermediate layer may be present therebetween. In addition, it is understood that when an element or layer is referred to as being "under" another element or layer, it may be directly under another element or layer, or at least one intermediate layer may be present therebetween. In addition, it is understood that when a layer or element is referred to as being "between" two layers or two elements, it may be the only layer or element between two layers or two elements, or more than one intermediate layer or element may also be present therebetween. Like reference numerals refer to like elements throughout.

Other embodiments of the present disclosure will be readily apparent to those skilled in the art upon consideration of the specification and practice of the disclosure disclosed herein. The present disclosure is intended to cover any variations, uses or adaptations of the present disclosure that follow the general principles of the present disclosure and include the common knowledge or conventional techniques not disclosed in this disclosure. The specification and embodiments are to be regarded as illustrative only, and the true scope and spirit of the disclosure is indicated by the appended claims.

It is appreciated that the present disclosure is not limited to the precise structure that has been described above and shown in the drawings, and various modifications and changes can be made without departing from the scope thereof. The scope of the present disclosure is limited only by the appended claims.

What is claimed is:

1. A touch panel, comprising:
   an array substrate;
   a color filter substrate;
   a liquid crystal layer disposed between the array substrate and the color filter substrate;
   a touch structure disposed in at least one of the array substrate and the color filter substrate; and
   a touch element configured to sense a touch action applied to the touch panel,
   wherein the touch structure comprises:
      a sensing film configure to sense a pressure applied on the sensing film to generate an electrical signal; and
      a heating film disposed on a side of the sensing film and configured to generate heat in response to a determination, based on the electrical signal, that a value of the pressure applied on the sensing film is greater than a preset pressure value.

2. The touch panel of claim 1, wherein the heating film is disposed on a side of the array substrate that is close to the liquid crystal layer, and the sensing film is disposed on the color filter substrate.

3. The touch panel of claim 2, wherein an insulating layer is provided between the heating film and the liquid crystal layer.

4. The touch panel of claim 1, wherein the heating film and the sensing film are provided at positions corresponding to a black matrix of the color filter substrate.

5. The touch panel of claim 1, wherein the sensing film includes at least one sensing unit, the heating film includes at least one heater, and projections of the at least one sensing film and the at least one heater on the array substrate are at least partially overlapped with each other.

6. The touch panel of claim 5, wherein the heater is made of a metal alloy material and includes a plurality of bending segments connected with one another.

7. The touch panel of claim 1, wherein the sensing film comprises a polymer-encapsulated carbon nanotube piezoelectric material or a polymer-encapsulated graphene semiconductor piezoelectric material.

8. The touch panel of claim 1, wherein the heating film and the sensing film each are made of a transparent material and disposed at positions corresponding to pixel areas of the color filter substrate.

9. A touch display device, comprising:
   the touch panel according to claim 1; and
   a driving chip configured to control the heating film to generate heat in response to a determination, based on the electrical signal generated from the sensing film, that the value of the pressure applied on the sensing film is greater than the preset pressure value, so as to heat a portion of the liquid crystal layer that is aligned with the heating film in a thickness direction of the touch panel.

10. A touch panel, comprising:
    an array substrate;
    a color filter substrate;
    a liquid crystal layer disposed between the array substrate and the color filter substrate;
    at least one touch element configured to sense a touch action applied on the touch panel and generate an electrical signal indicating a value of a pressure applied on the touch element; and
    a heating film disposed on a side of the touch element and configured to generate heat in response to a determination, based on the electrical signal, that the value of the pressure applied on the touch element is greater than a preset pressure value, so as to heat a portion of the liquid crystal layer that is aligned with the heating film in a thickness direction of the touch panel.

11. The touch panel of claim 10, wherein the heating film is disposed on a side of the array substrate that is close to the liquid crystal layer, and an insulating layer is disposed between the heating film and the liquid crystal layer.

12. The touch panel of claim 10, wherein the heating film is disposed at a position corresponding to a black matrix of the color filter substrate.

13. The touch panel of claim 10, wherein the heating film includes at least one heater, and projections of the at least one touch element and the at least one heater on the array substrate are at least partially overlapped with each other.

14. The touch panel of claim 13, wherein the heater is made of a metal alloy material and includes a plurality of bending segments connected with one another.

15. A touch display device, comprising:
    the touch panel according to claim 10; and
    a driving chip configured to control the heating film to generate heat in response to the determination, based on the electrical signal generated from the touch element, that the value of the pressure applied on the touch panel is greater than the preset pressure value.

* * * * *